US006603690B1

United States Patent
Chen et al.

(10) Patent No.: US 6,603,690 B1
(45) Date of Patent: Aug. 5, 2003

(54) LOW-POWER STATIC COLUMN REDUNDANCY SCHEME FOR SEMICONDUCTOR MEMORIES

(75) Inventors: Howard Hao Chen, Yorktown Heights, NY (US); Louis Lu-Chen Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/091,663

(22) Filed: Mar. 6, 2002

(51) Int. Cl.[7] .................................................. G11C 7/00

(52) U.S. Cl. ............. 365/200; 365/189.07; 365/189.12; 365/225.7

(58) Field of Search .............................. 365/200, 225.7, 365/49, 189.07, 189.12

(56) References Cited

U.S. PATENT DOCUMENTS

| | | | | |
|---|---|---|---|---|
| 5,636,227 A | * | 6/1997 | Segars ........................ | 714/729 |
| 5,677,917 A | * | 10/1997 | Wheelus et al. ............ | 714/726 |
| 6,081,910 A | * | 6/2000 | Mifsud et al. .............. | 714/718 |
| 6,292,422 B1 | * | 9/2001 | Pitts ........................ | 365/225.7 |

OTHER PUBLICATIONS

Yasuhara Sato, et al. (1998) "Fast Cycle RAM (FCRAM); a 20–ns Random Row Access, Pipe–Lined Operating DRAM", Symposium on VLSI Circuits Digest of Technical Papers, pp. 22–25.

Yoshinori Okajima, et al. (2000) "An 0.18um Embedded FCRAM ASIC with DRAM Density and SRAM Performance", IEEE, pp. 37–39.

* cited by examiner

Primary Examiner—Son T. Dinh
(74) Attorney, Agent, or Firm—Scully, Scott, Murphy & Presser; Daniel P. Morris, Esq.

(57) ABSTRACT

A static column redundancy scheme for a semiconductor memory such as an eDRAM. By utilizing the existing scan registers for SRAM array testing, the column redundancy information of each bank or each microcell of the memory chip can be scanned, stored and programmed during the power-on period. Two programming methods are disclosed to find the column redundancy information on the fly. In the first method, the column redundancy information is first stored in the SRAM, and is then written into the program registers of the corresponding bank or microcell location. In the second method, the column redundancy information is loaded directly into the program registers of a bank or microcell location according to the bank address information without loading the SRAM. Since the new static column redundancy scheme does not need to compare the incoming addresses, it eliminates the use of control and decoding circuits, which significantly reduces the power consumption for memory macros.

18 Claims, 9 Drawing Sheets eDRAM Column Redundancy Circuit Diagram

Dynamic Column Redundancy Scheme Using 256 MUX Switches

Dynamic Column Redundancy Scheme Using 32 MUX Switches

64 Control Lines
32 Mux Switches

Flow Chart of the First Embodiment

Flow Chart of the Second Embodiment

LOW-POWER STATIC COLUMN REDUNDANCY SCHEME FOR SEMICONDUCTOR MEMORIES

BACKGROUND OF THE INVENTION

1. Field of the Invention

The present invention relates generally to a low-power static column redundancy scheme for semiconductor memory chips, more specifically for embedded memory chips such as dynamic random access memories (eDRAM), and more particularly pertains to a low-power static column redundancy scheme for a wide data-width eDRAM macro which uses existing eDRAM hardware and eliminates unnecessary power consumption.

2. Discussion of the Prior Art

The present invention has applicability to many different types of semiconductor memory chips, although the following discussion and the exemplary embodiments herein concern embedded dynamic random access memories (eDRAM) in particular.

Embedded dynamic random access memories (eDRAM) with wide data width have been proposed to replace static random access memories (SRAM) for high-speed data access in L2 cache applications. Since each DRAM cell has only one transistor and one capacitor, compared to an SRAM cell that has six transistors, the size of an eDRAM cache can be significantly smaller than the size of an SRAM cache. In order to reduce the data access time, eDRAM arrays are typically fabricated as a plurality of small arrays called microcells. Each microcell usually contains 64 to 256 word lines and 64 to 256 bit-line pairs, and is 16× to 256× smaller than a bank of a stand-alone DRAM, which typically has 1,024 word lines and 1,024 bit-line pairs. Since each eDRAM array operation only requires one microcell to be activated, the lighter loading of word lines and bit lines in a microcell can significantly improve the data access speed.

The large size of an eDRAM macro often requires the use of a small SRAM macro as the cache interface between the eDRAM and the processor for data read/write operations. A wide internal bus is provided to transfer data among the eDRAM, the SRAM, and the processor. A small TAG memory may also be added to record the microcell address of the data stored in the SRAM. Since all the data along a selected word line are retrieved, no additional column decoding is necessary.

One of the key challenges in the design of a wide data-width eDRAM is to provide an effective column redundancy scheme to fix defective column elements. In a conventional DRAM array, bit-line pairs are hierarchically grouped by the column addresses. Since the data are selected from only one group of bit-line pairs each time, the most common column redundancy scheme uses the existing column address and repairs the entire group of bit-line pairs. However, for a wide data-width eDRAM design, all the bit lines from the eDRAM macro are simultaneously fed into the SRAM, and all the data lines from the SRAM are directly fed into the processor. It is difficult to identify and fix the failed bit lines without significantly increasing the chip size.

Two column redundancy schemes have been recently proposed for a wide data-width eDRAM:

[1] A dynamic redundant column swapping scheme was proposed in YOR8-2000-1212, entitled "Column Redundancy Scheme for Wide Bandwidth Embedded DRAM."
In this disclosure, the incoming addresses in each cycle are compared to the addresses of failed components stored in the fuse bank. If a match is found, an internal column address is created and used to perform the column redundancy swapping operation. The address matching and redundancy swapping operations can be done in a pipeline cycle with high speed, but its high power consumption makes it unsuitable for low-power applications such as hand-held and portable devices.

[2] A dynamic redundant microcell swapping scheme was proposed in YOR8-2001-0001, entitled "A New Microcell Redundancy Scheme for High Performance eDRAM." Instead of swapping the defective word lines and bit lines, the entire microcell is replaced, which requires the size of each microcell to be small and the number of micro cells to be large. Since the dynamic replacement scheme for microcell swapping is similar to column swapping, it also consumes a lot of power and is not suitable for low-power applications.

SUMMARY OF THE INVENTION

Accordingly, it is a primary object of the present invention to provide a low-power static column redundancy scheme for semiconductor memory chips.

A more specific object of the subject invention is the provision of a low-power, static column redundancy scheme for a wide data-width eDRAM macro by using existing eDRAM hardware and eliminating unnecessary power consumption.

BRIEF DESCRIPTION OF THE DRAWINGS

The foregoing objects and advantages of the present invention for a low-power static column redundancy scheme for semiconductor memories may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

Figure 1:
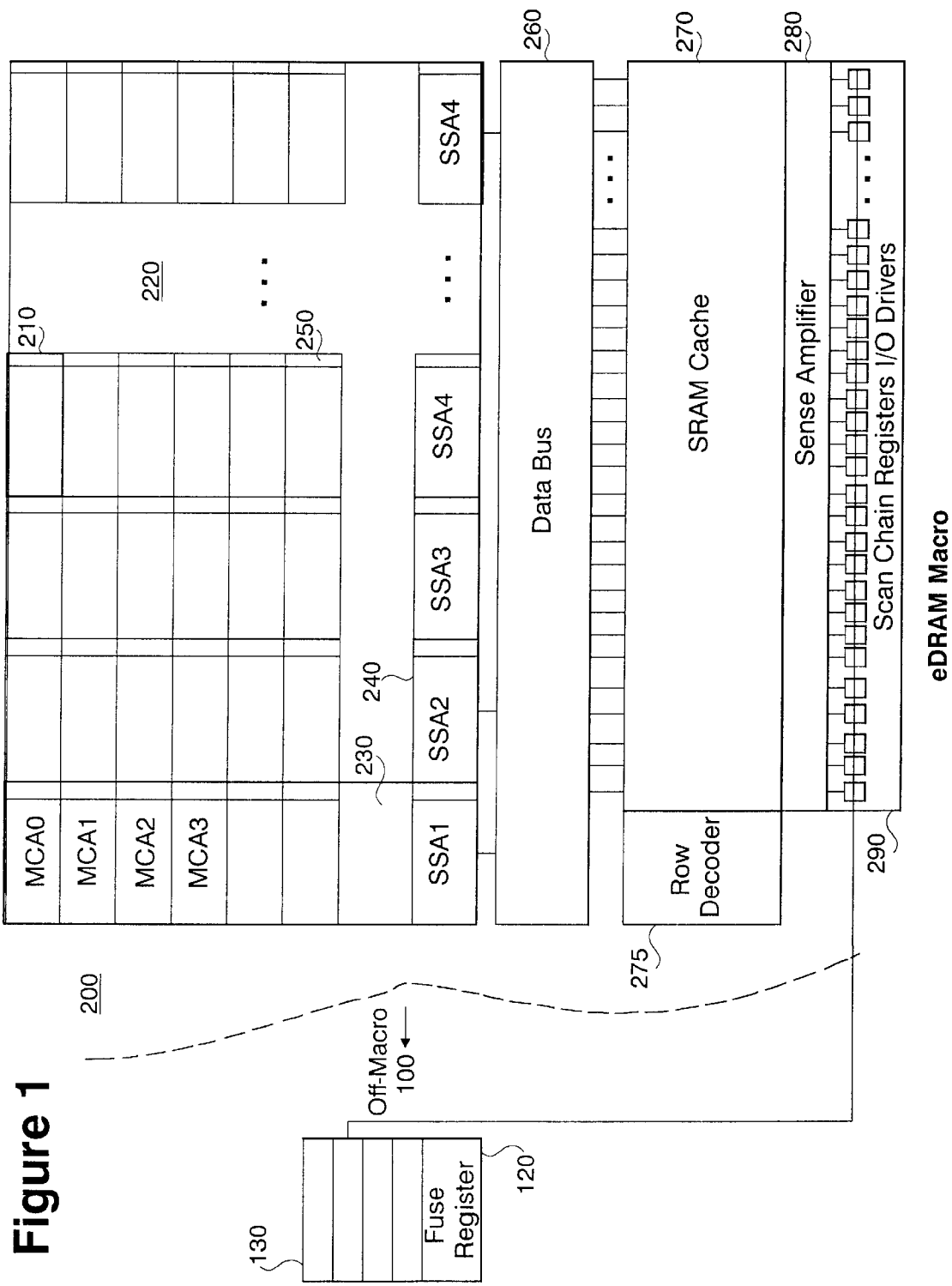
FIG. 1 shows an eDRAM macro that consists of a plurality of memory bank units wherein each memory bank contains a plurality of microcells and a secondary sense amplifier, and each microcell includes a column redundancy element.

FIG. 1 shows an eDRAM macro 220 that consists of a plurality of memory bank units 230, MCAn. Each memory bank contains a plurality of microcells 210 and a secondary sense amplifier 240, SSAn, and each microcell includes a row decoding element 250. In addition, the eDRAM macro 220 is connected to an SRAM macro 270, a chain of scan shift registers (scan-chain registers or scan registers) 290, and a fuse bank 120. The scan registers are used to access the SRAM 270 internally. To test the functionality of the SRAM, the incoming data bits can be sequentially streamed in and loaded into the scan shift-registers. The data can then be written into any row of the SRAM, and read out through the same scan-chain registers.

In a first embodiment of the present invention, for a particular eDRAM memory bank, the fuse information on defective column elements is first scanned from the fuse bank 120 to the scan registers 290 during the power-on period. Then the fuse information on a particular selected eDRAM bank is loaded into a corresponding word line of the SRAM, and this operation is repeated for each successive memory bank until the fuse information for each of the memory banks have been loaded into its corresponding word line of the SRAM, and all of the memory banks are completed, such that the fuse information on different eDRAM banks are first loaded the SRAM.

Finally, for a particular eDRAM memory bank, the fuse information is loaded from its corresponding word line of the SRAM into the program registers in the secondary sense amplifiers SSAs of that memory bank. Instead of writing data into the word lines, the program registers are programmed by a simple WRITE operation from the SRAM to the eDRAM. This operation is performed in sequence for each memory bank until all memory banks have been completed. After the power-on redundancy programming sequence is complete, the chip is ready for active-mode operation.

The fuse bank 120, which can be located inside the eDRAM macro (area 200) or outside the eDRAM macro (area 100), contains information such as defective column addresses, redundant column addresses, and the corresponding-bank addresses 130. For an 8-bank eDRAM, if only one column repair is allowed within each bank, then only 8 sets of addresses are needed. Once the column redundancy devices are programmed, the defective columns are replaced with redundant columns. By using latch-type of register devices for the program registers in the SSAs of the memory banks the programmed replacement columns will remain active as long as the chip stays powered on. Unlike a dynamic column redundancy scheme, the static column redundancy replacement scheme of the present invention does not require operations such as address comparison and column decoding. Therefore power consumption is reduced during normal eDRAM operations.

Figure 2:
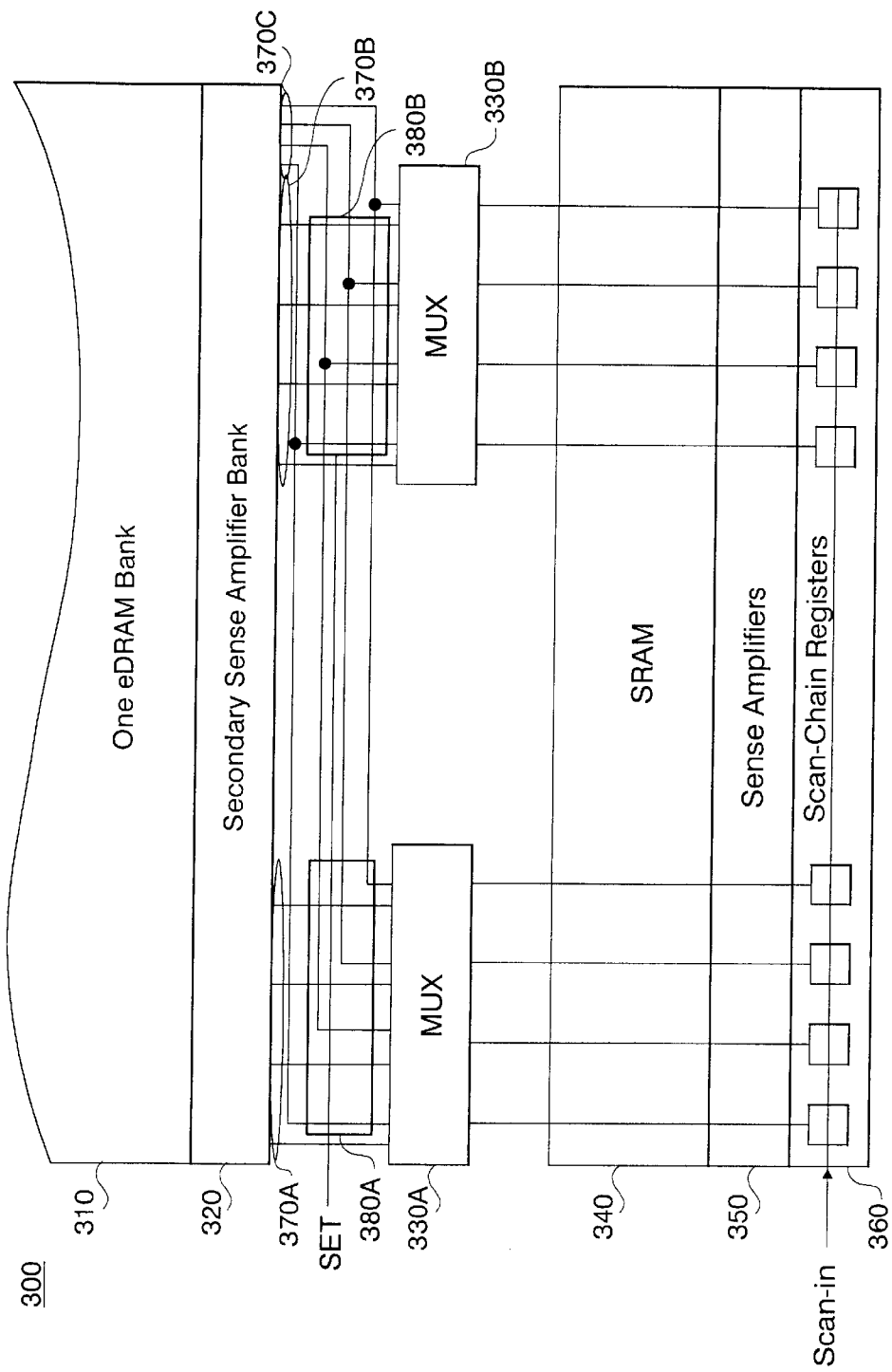
FIG. 2 shows a column redundancy scheme of one eDRAM bank and its secondary sense amplifier wherein each eDRAM bank has 128 bit lines which are divided into 32 groups of 4 bit lines and one group of 4 redundant bit lines.

FIG. 2 shows a column redundancy scheme of one eDRAM bank 310 and its secondary sense amplifier 320. Each eDRAM bank has 128 bit lines, which are divided into 32 groups of 4 bit lines 370A, 370B, and one group of 4 redundant bit lines 370C. Each group of 4 bit lines has an MUX switch 330$n$ and a program register 380$n$ to conduct the column replacement procedure. In a first operation, the data are first scanned by the scan register chain 360 and loaded into the corresponding word line of the SRAM 340 by the sense amplifiers 350 and this operation is repeated for each successive memory bank until all of the memory banks have been completed.

Then in a second operation the data are loaded from a corresponding word line in the SRAM to the program registers in the secondary sense amplifiers in each bank, and this operation is repeated for each successive corresponding word line and each memory bank until all of the memory banks have been completed and are programmed.

In a second embodiment, for each memory the data are transferred directly from the scan registers to the program registers in the secondary sense amplifiers of each eDRAM bank without being stored in the SRAM and this operation is repeated for each successive memory bank until all of the memory banks have been completed. In the second embodiment, the fuse information also includes the particular memory bank address, so that the defective column information stored in the scan registers can be properly directed to the program registers of the correct memory bank.

Figure 3:
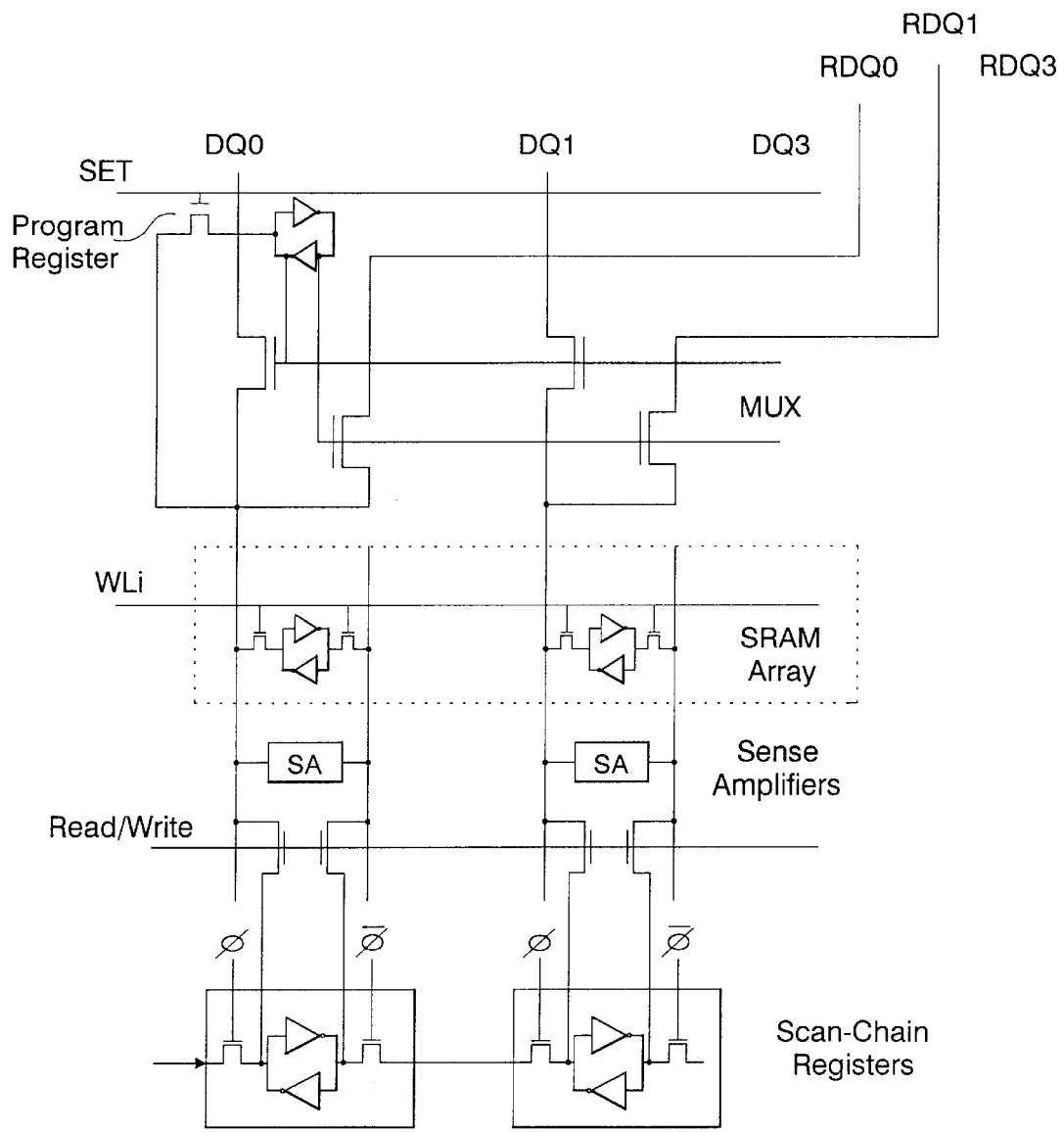
FIG. 3 is a circuit schematic of an eDRAM which provides for a column redundancy operation.

FIG. 3 is a circuit schematic of an eDRAM which provides for a column redundancy operation. The SRAM array includes a plurality of cells and word lines WL. Sense amplifiers SA are used for SRAM data sensing. The input of a program register cell is controlled by the SET signal. To avoid data racing, the scan chain registers use a pair of non-overlapping true/complement clocks ø, ø during data scanning. After the data are fully scanned and latched into the scan-chain registers, the data can be loaded into their respective program registers. The READ/WRITE control is used to turn on the switches between the scan-chain register latches and the data lines DQn of the SRAM. The sense amplifiers SA amplify the signals that develop along the data lines.

In the first embodiment, the selected corresponding word line WL in the SRAM is switched on and the data is stored in the SRAM before being transferred to the program registers in the secondary sense amplifiers of each bank.

In the second embodiment, the SET signal is turned on and the data are transferred directly from the scan-chain registers into the program registers in the secondary sense amplifiers of the eDRAM. Only one of the 32 program registers in each bank is selected and programmed at one time, and this operation is repeated 32 times. The selected program register then swaps its 4 internal data lines with the 4 redundant data lines. Once the program register is programmed, the SET switches and the READ/WRITE switches are turned off. The state of each program register remains unchanged until the power is removed from the system.

Figure 4:
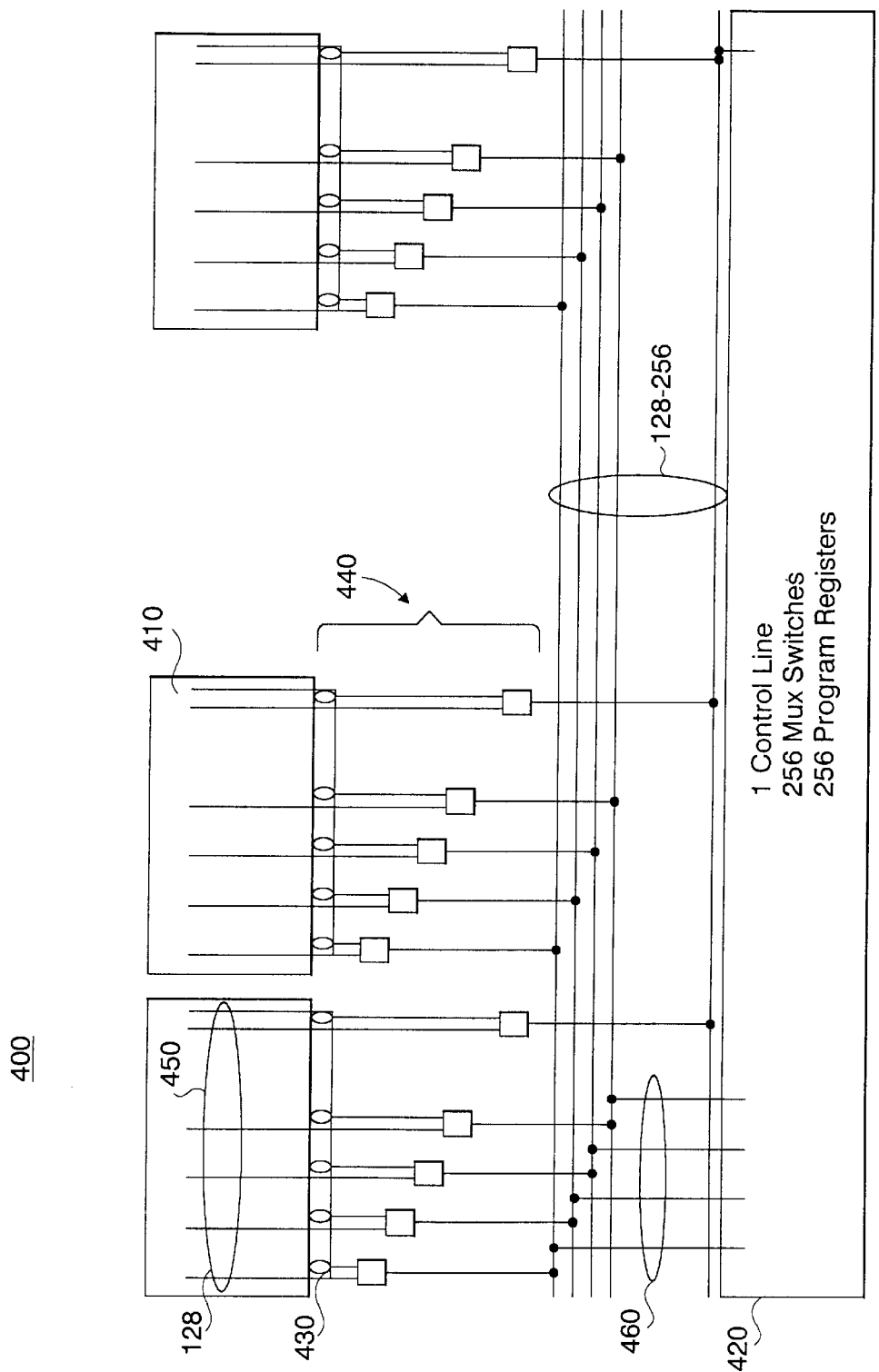
FIG. 4 is a detailed diagram of a static column redundancy scheme for an eDRAM macro.

FIG. 4 is a detailed diagram of a static column redundancy scheme for an eDRAM macro. For each eDRAM bank 410, there are 128 bit-line pairs, 4 redundant bit-line pairs, 32 program registers 430, and 32 MUX switches 440. If the data lines are single-directional for simultaneous READ/WRITE operations, there will be 256 data lines.

The overhead hardware 420 consists of one control line (SET line), 256 MUX switches, and 256 program registers, and is smaller than a prior art dynamic column redundancy scheme, due to a significant reduction of control lines.

Figure 5:
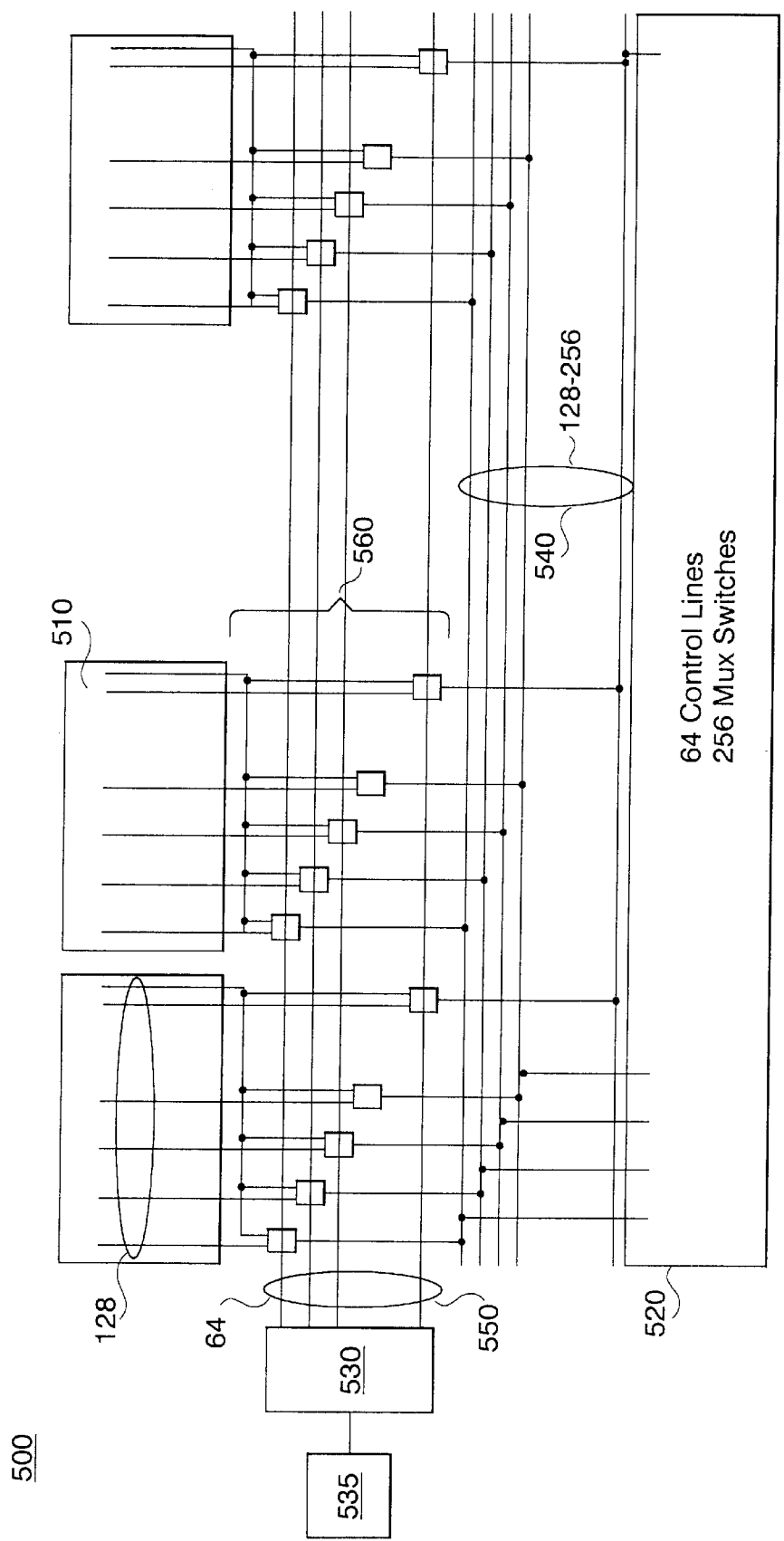
FIG. 5 shows a prior art dynamic column redundancy scheme which requires 64 control lines, 256 MUX switches, and additional circuits such as an address comparator and a column decoder.

In comparison, FIG. 5 shows a prior art dynamic column redundancy scheme which requires 64 control lines 550, 256 MUX switches 560, and additional circuits such as an address comparator 535 and a column decoder 530. Since a new column address is immediately generated to decode and program the redundancy when a new bank is accessed, the 256 MUX switches in each bank can be shared by all the banks.

Figure 6:
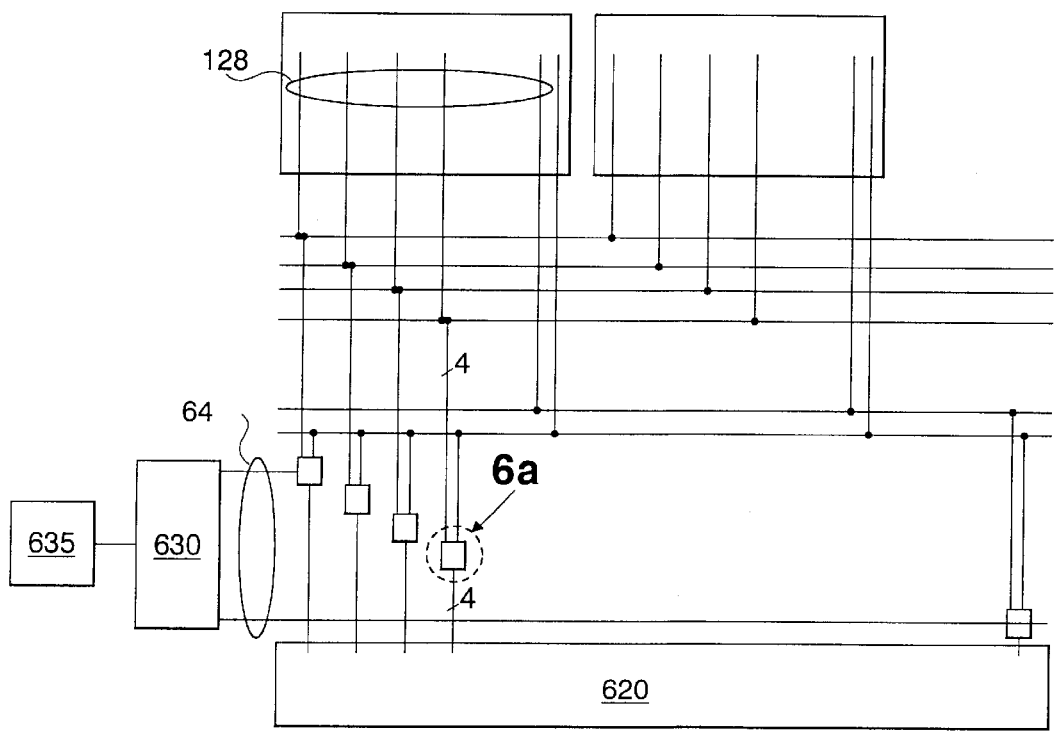
FIG. 6 shows an improved prior art dynamic column redundancy scheme with 64 control lines and 32 MUX switches.
Figure 6A:
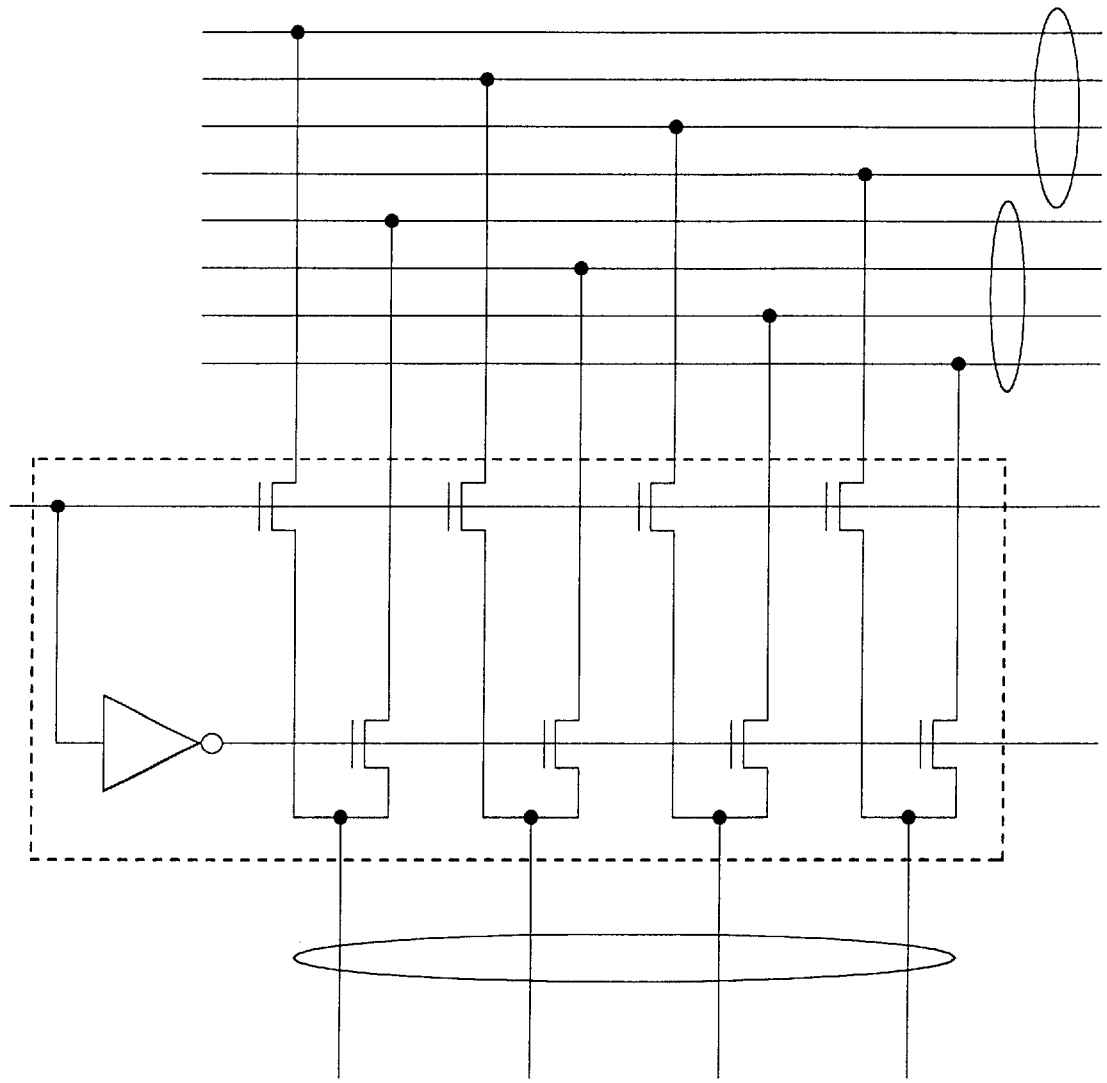

FIG. 6 shows an improved prior art dynamic column redundancy scheme with 64 control lines and 32 MUX switches. The detailed schematic of a 4-to-4 MUX switch is also shown. The column decoder 630 uses 32 pairs of control lines to select one of the 32 groups of 4 bit-line pairs for repair.

Figure 7:
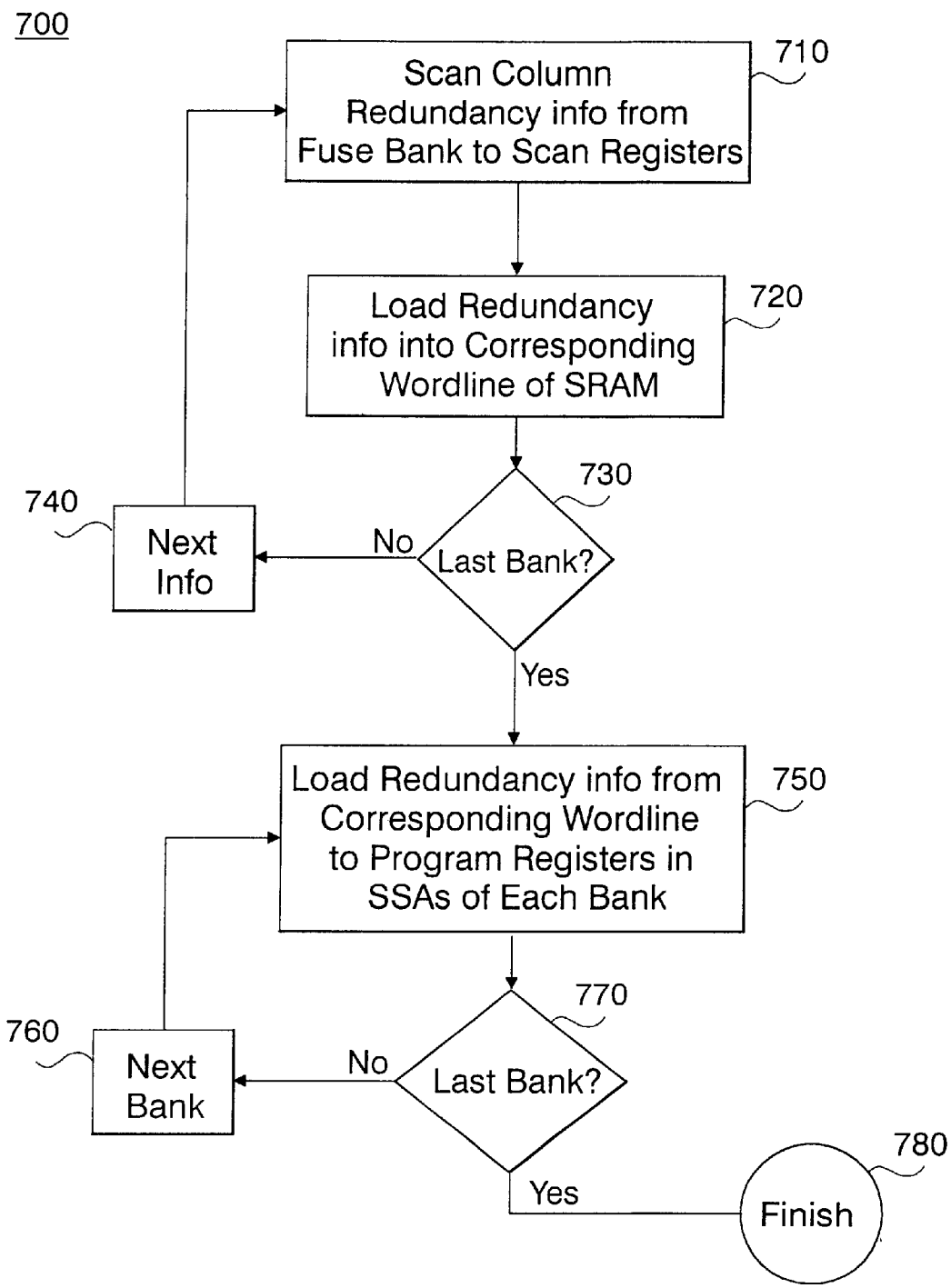
FIG. 7 is a logic flow diagram for a first embodiment of the present invention wherein, for each eDRAM bank, the scan register first scans the column redundancy information from the fuse bank to the scan registers, and then loads the information into a corresponding wordline of the SRAM, and this operation is repeated for all memory banks, and then for each eDRAM memory bank, the column redundancy information is written from the corresponding word line of the SRAM to the program registers in the secondary sense amplifiers SSAs of each memory bank, and this operation is repeated for each corresponding word line and each memory bank until the redundancy programming activity is completed for all of the memory banks.

FIG. 7 is a logic flow diagram for the first embodiment of the present invention. For each eDRAM memory bank, the scan registers first scan the column redundancy information from the fuse bank to the scan-chain registers at 710, and then load the information into the corresponding word line of the SRAM at 720, and this operation is repeated for each memory bank and each corresponding word line of the SRAM at 730 and 740 until all memory banks are completed.

Then for each eDRAM memory bank, the column redundancy information is written from the corresponding word line of the SRAM to the program registers in the secondary sense amplifiers SSAs of each memory bank at 750, and this operation is repeated for each corresponding word line and each memory bank at 770 and 760 until the redundancy programming activity is completed for all of the memory banks at 780.

Figure 8:
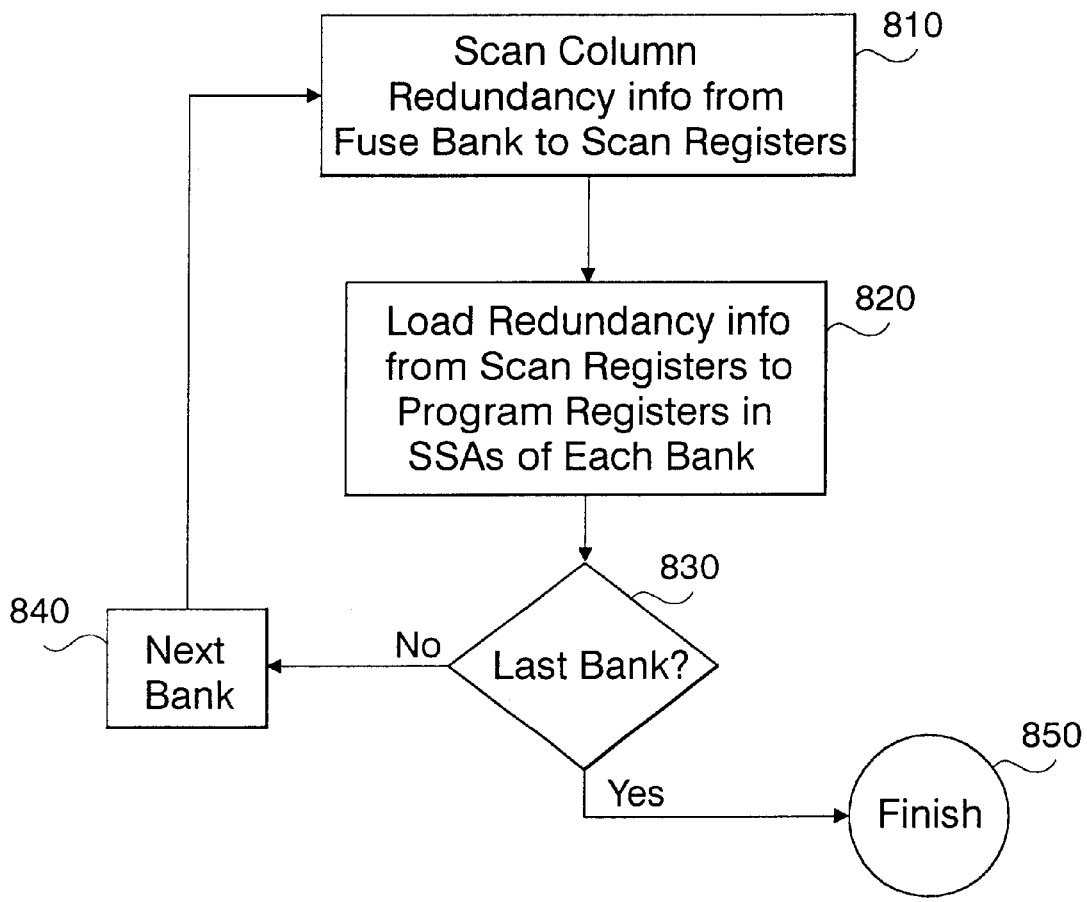
FIG. 8 is a logic flow diagram for a second embodiment of the present invention wherein the scan registers scan the column redundancy information, which includes bank address information, from the fuse bank, and then immediately store the information in the program registers of the secondary sense amplifier SSA of the corresponding bank, and this operation is repeated for all memory banks.

FIG. 8 is a logic flow diagram for the second embodiment of the present invention. For each memory bank, in a first step the scan-chain registers scan the column redundancy information, which includes bank address information, from the fuse bank to the scan-chain registers at 810. Then, in a second step the column redundancy information is loaded from the scan registers into the program registers in the secondary sense amplifiers SSAs of memory bank at 820. This operation is then repeated for each memory bank at 830 and 840 until all memory banks are completed at 850. Due the simplicity of this process, the second embodiment is a preferred method for column redundancy design.

While several embodiments and variations of the present invention for a low-power static column redundancy scheme for semiconductor memories are described in detail herein, it should be apparent that the disclosure and teachings of the present invention will suggest many alternative designs to those skilled in the art.

Having thus described our invention, what we claim as new, and desire to secure by Letters Patents is:

1. A method for a static column redundancy scheme to fix defective column elements in a semiconductor memory chip, wherein the memory chip comprises a plurality of memory banks, each bank includes a column redundancy element, the memory chip is connected to an SRAM, scan-chain registers are used to access the SRAM, and a fuse bank contains fuse data on defective column elements in the memory chip, the method comprising:

scanning fuse data on defective columns of a memory bank from the fuse bank into the scan-chain registers;

loading fuse data from the scan-chain registers into a corresponding word line of the SRAM;

loading fuse data from a corresponding word line of the SRAM into program registers in secondary sense amplifiers of the memory bank by a write operation from the SRAM into the memory bank.

2. The method of claim 1, wherein said memory chip is an embedded dynamic access memory (eDRAM).

3. The method of claim 1, wherein the step of scanning is performed during a power-on period.

4. The method of claim 1, wherein latch-type registers are used as the program registers in the secondary sense amplifiers of each memory bank such that a programmed replacement column remains active as long as the memory chip stays powered on.

5. The method of claim 1, wherein the step of loading fuse data into a corresponding word line of the SRAM is performed in sequence by loading fuse data for each memory bank into a corresponding word line of the SRAM, and this operation is repeated for each different memory bank and each corresponding word line until all memory banks have been completed.

6. The method of claim 1, wherein the step of loading fuse data into program registers is performed in sequence by loading fuse data for each memory bank into the program registers of the secondary sense amplifiers of that memory bank, and this operation is repeated for each memory bank until all memory banks have been completed.

7. The method of claim 1, wherein the fuse data contains information on defective column addresses, redundant column addresses, and the corresponding memory bank addresses.

8. The method of claim 1, wherein each memory bank has a secondary sense amplifier bank and 128 bit lines, which are divided into 32 groups of 4 bitlines and one group of 4 redundant bitlines.

9. The method of claim 1, wherein the fuse data are loaded into the corresponding word line of the SRAM by the sense amplifiers of the SRAM, and then the fuse data are loaded from the SRAM to the program registers in the secondary sense amplifiers in each memory bank, one memory bank at a time until all of the memory banks are programmed with the fuse data.

10. The method of claim 2, wherein the eDRAM comprises a wide data-width eDRAM wherein all of the bit lines from the eDRAM macro are simultaneously fed into the SRAM, and all of the data lines from the SRAM are directly fed into a processor.

11. A method for a static column redundancy scheme to fix defective column elements in a semiconductor memory chip, wherein the memory chip comprises a plurality of memory banks, each memory bank includes a column redundancy element, the memory chip is connected to an SRAM, scan-chain registers are used to access the SRAM, and a fuse bank contains fuse data on defective column elements in the memory bank, the method comprising:

scanning fuse bank data on defective columns of memory banks from the fuse bank into the scan-chain registers;

transferring the data directly from the scan-chain registers into the program registers in the secondary sense amplifiers of the memory banks, wherein the fuse information includes a particular memory bank address, so that the defective column information stored in the scan registers is directed to the program registers of the correct memory bank.

12. The method of claim 11, wherein said memory chip is an embedded dynamic access memory (eDRAM).

13. The method of claim 11, wherein the step of scanning is performed during a power-on period.

14. The method of claim 10, wherein latch-type registers are used for the program registers in the secondary sense amplifiers of the memory banks such that each programmed replacement column remains active as long as the memory chip stays powered on.

15. The method of claim 11, wherein a read/write control is used to turn on switches between the scan register latches and the data lines of the SRAM, and sense amplifiers of the SRAM amplify the signals that develop along the data lines.

16. The method of claim 11, wherein a set signal is turned on and the data are transferred directly into the program registers in the secondary sense amplifiers of the memory chip, and only one of the program registers in each bank is selected and programmed at one time, and the operation is repeated for all of the program registers in each bank until completed.

17. The method of claim 11, wherein overhead hardware consists of one set control line, n MUX witches, and n program registers.

18. The method of claim 17, wherein after the program register is programmed, set switches and read/write switches are turned off, and the state of each program register remains unchanged until the next power-on testing.

* * * * *